US009811105B2

(12) United States Patent
Sugiura et al.

(10) Patent No.: US 9,811,105 B2
(45) Date of Patent: Nov. 7, 2017

(54) REFERENCE VOLTAGE CIRCUIT

(71) Applicant: Seiko Instruments Inc., Chiba-shi, Chiba (JP)

(72) Inventors: Masakazu Sugiura, Chiba (JP); Tsutomu Tomioka, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 429 days.

(21) Appl. No.: 14/596,923

(22) Filed: Jan. 14, 2015

(65) Prior Publication Data

US 2015/0212536 A1 Jul. 30, 2015

(30) Foreign Application Priority Data

Jan. 27, 2014 (JP) ................................ 2014-012660

(51) Int. Cl.
*G05F 3/16* (2006.01)
*H03K 5/153* (2006.01)
*G05F 3/24* (2006.01)

(52) U.S. Cl.
CPC .................. *G05F 3/16* (2013.01); *G05F 3/24* (2013.01); *Y10T 307/549* (2015.04)

(58) Field of Classification Search
CPC ......................................................... G05F 3/16
USPC ............................................................ 307/52
See application file for complete search history.

(56) References Cited

U.S. PATENT DOCUMENTS 5,451,890 A * 9/1995 Martin ............... H03K 19/0952 326/117
2005/0242870 A1* 11/2005 Aota ......................... G05F 3/24 327/541
2007/0103207 A1* 5/2007 Huang .................. H03F 1/3205 327/108
2010/0182086 A1* 7/2010 Cozzolino ............... H03F 3/505 330/253

FOREIGN PATENT DOCUMENTS

JP 2005-134939 A 5/2005

* cited by examiner

*Primary Examiner* — Joseph Chang
(74) *Attorney, Agent, or Firm* — Brinks Gilson & Lione Chicago, IL

(57) ABSTRACT

To provide a reference voltage circuit capable of outputting a reference voltage excellent in temperature characteristic. A reference voltage circuit includes a first constant current circuit, a first transistor of a first conductivity type which has a source connected to the first constant current circuit and is operated as a first stage source follower, a second constant current circuit, and a second transistor of a second conductivity type which has a gate connected to the source of the first transistor and a source connected to the second constant current circuit and is operated as a second stage source follower. The reference voltage circuit is configured to output a reference voltage from the source of the second transistor.

8 Claims, 3 Drawing Sheets

REFERENCE VOLTAGE CIRCUIT

RELATED APPLICATIONS

This application claims priority under 35 U.S.C. §119 to Japanese Patent Application No. 2014-012660 filed on Jan. 27, 2014, the entire content of which is hereby incorporated by reference.

BACKGROUND OF THE INVENTION

1. Field of the Invention

The present invention relates to a reference voltage circuit which outputs a reference voltage excellent in temperature characteristic.

2. Background Art

A related art reference voltage circuit will be described. FIG. 6 is a circuit diagram illustrating the related art reference voltage circuit.

The related art reference voltage circuit is equipped with an NMOS depletion transistor 601, an NMOS transistor 602, a ground terminal 100, an output terminal 102, and a power supply terminal 101.

In the related art reference voltage circuit, a gate and source of the NMOS depletion transistor 601 are connected to each other, and a gate and drain of the NMOS transistor 602 are connected to each other. They are connected in series and a connecting point therebetween is defined as the output terminal.

The related art reference voltage circuit uses the NMOS depletion transistor 601 as a constant current source and extracts a voltage generated in the NMOS transistor 602 as a reference voltage Vref. As the reference voltage Vref, the sum of an absolute value Vtnd of a threshold voltage of the NMOS depletion transistor 601 and a threshold voltage Vtne of the NMOS transistor 602 is outputted (refer to, for example, FIG. 10 in Patent Document 1).

Patent Document 1

Japanese Patent Application Laid-Open No. 2005-134939

SUMMARY OF THE INVENTION

The related art reference voltage circuit is however accompanied by a problem that since the threshold voltage of the NMOS transistor 601 changes under the influence of a back gate voltage based on a variation in the threshold voltage of the NMOS transistor 602, it is difficult therefor to output a reference voltage excellent in temperature characteristic. Also, a problem arises in that the speed at which the reference voltage rises is slow when a power supply is started.

The present invention has been made in view of the above problems and provides a reference voltage circuit which is capable of outputting a reference voltage excellent in temperature characteristic and is quick in starting.

In order to solve the related art problems, one aspect of the present invention provides a reference voltage circuit configured as follows:

The reference voltage circuit includes a first constant current circuit, a first transistor of a first conductivity type which has a source connected to the first constant current circuit and is operated as a first stage source follower, a second constant current circuit, and a second transistor of a second conductivity type which has a gate connected to the source of the first transistor and a source connected to the second constant current circuit and which is operated as a second stage source follower. The reference voltage circuit is configured to output a reference voltage from the source of the second transistor.

The reference voltage circuit of the present invention is capable of outputting a reference voltage excellent in temperature characteristic. Further, the reference voltage can be raised rapidly when a power supply is started up.

DETAILED DESCRIPTION OF THE PREFERRED EMBODIMENTS

Preferred embodiments of the present invention will hereinafter be described with reference to the accompanying drawings.

First Embodiment

Figure 1:
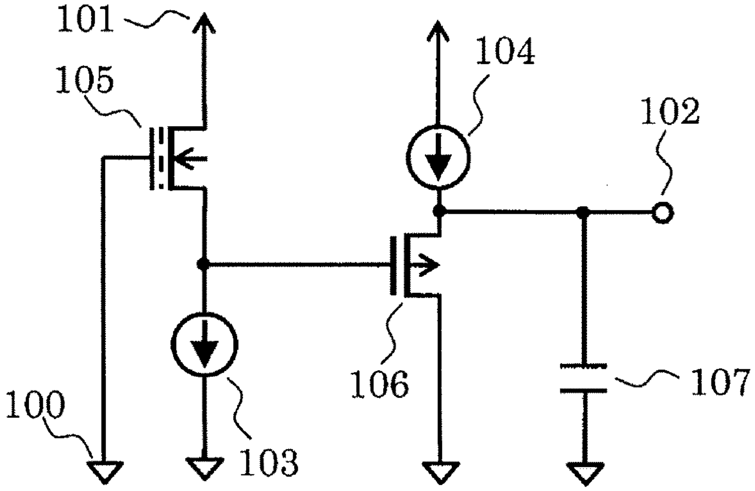
FIG. 1 is a circuit diagram illustrating a configuration of a reference voltage circuit according to a first embodiment.

FIG. 1 is a circuit diagram of a reference voltage circuit according to a first embodiment.

The reference voltage circuit according to the first embodiment has an NMOS depletion transistor 105, a PMOS transistor 106, constant current circuits 103 and 104, a capacitor 107, a ground terminal 100, an output terminal 102, and a power supply terminal 101.

A description will next be made about the connections of the reference voltage circuit according to the first embodiment. The NMOS depletion transistor 105 has a gate connected to the ground terminal 100, a drain connected to the power supply terminal 101, and a source connected to one terminal of the constant current circuit 103. The other terminal of the constant current circuit 103 is connected to the ground terminal 100. The PMOS transistor 106 has a gate connected to the source of the NMOS depletion transistor 105, a drain connected to the ground terminal 100, and a source connected to the output terminal 102. The constant current circuit 104 has one terminal connected to the power supply terminal 101, and the other terminal connected to the output terminal 102. The capacitor 107 has one terminal connected to the output terminal 102, and the other terminal connected to the ground terminal 100.

The operation of the reference voltage circuit according to the first embodiment will next be described. The NMOS depletion transistor 105 configures a first stage source follower with the constant current circuit 103 as a load. The PMOS transistor 106 configures a second stage source follower with the constant current circuit 104 as a load. An absolute voltage of a threshold voltage of the NMOS depletion transistor 105 is assumed to be Vtnd, and a threshold voltage of the PMOS transistor 106 is assumed to be Vtpe.

When a power supply voltage VDD is applied to the power supply terminal 101, the voltage Vtnd occurs in the source of the NMOS depletion transistor 105. This is achieved by increasing an aspect ratio of the NMOS depletion transistor 105 and decreasing a current value of the constant current circuit 103 to make a gate-source voltage Vgs substantially equal to the absolute value Vtnd of the threshold voltage of the NMOS depletion transistor 105. Since the voltage Vtnd is applied to the gate of the PMOS transistor 106, a voltage (Vtnd+Vtpe) occurs in the source thereof. This is achieved by increasing an aspect ratio of the PMOS transistor 106 and decreasing a current value of the constant current circuit 104 to make a gate-source voltage Vgs substantially equal to the threshold voltage Vtpe. Thus, when a reference voltage Vref generated at the output terminal 102 is taken to be Vref, the reference voltage Vref becomes Vref=Vtnd+Vtpe. The capacitor 107 is provided at the output terminal 102 to stabilize the reference voltage Vref.

The NMOS depletion transistor 105 has a characteristic that the absolute value Vtnd of the threshold voltage becomes large as the temperature becomes high. The PMOS transistor 106 has a characteristic that the threshold voltage Vtpe becomes small as the temperature becomes high. Since the reference voltage Vref is a voltage obtained by adding the threshold voltage Vtnd that becomes large as the temperature increases, and the threshold voltage Vtpe that becomes small as the temperature increases, it becomes a voltage excellent in temperature characteristic if their temperature characteristics are set to be canceled out.

As described above, the reference voltage circuit according to the first embodiment can output the reference voltage Vref excellent in temperature characteristic by using the source follower of the NMOS depletion transistor 105 and the source follower of the PMOS transistor 106.

Second Embodiment

Figure 2:
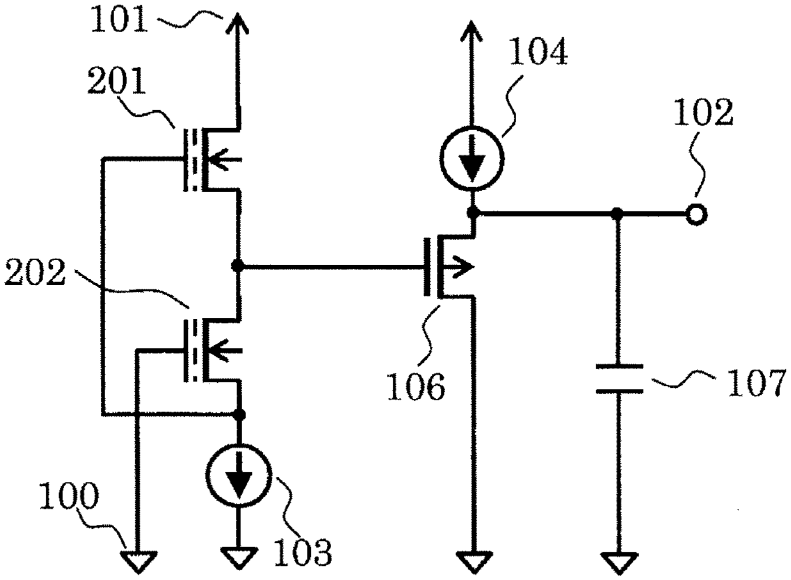
FIG. 2 is a circuit diagram illustrating a configuration of a reference voltage circuit according to a second embodiment.

FIG. 2 is a circuit diagram of a second voltage circuit according to a second embodiment. A difference from FIG. 1 resides in that the NMOS depletion transistor 105 is changed to NMOS depletion transistors 201 and 202. Others are similar to those in FIG. 1.

A description will next be made about the connections of the reference voltage circuit according to the second embodiment. The NMOS depletion transistor 202 has a gate connected to the ground terminal 100, a source connected to one terminal of the constant current circuit 103, and a drain connected to the gate of the PMOS transistor 106. The NMOS depletion transistor 201 has a gate connected to the source of the NMOS depletion transistor 202, a source connected to the gate of the PMOS transistor 106, and a drain connected to the power supply terminal 101. Others are similar to those in FIG. 1.

The operation of the reference voltage circuit according to the second embodiment will next be described. The NMOS depletion transistor 202 configures a source follower with the constant current circuit 103 as a load. The PMOS transistor 106 configures a second stage source follower with the constant current circuit 104 as a load. The NMOS depletion transistor 201 configures a first stage source follower with the constant current circuit 103 and the NMOS depletion transistor 202 as a load. An absolute value of each of threshold voltages of the NMOS depletion transistors 201 and 202 is assumed to be Vtnd, and a threshold voltage of the PMOS transistor 106 is assumed to be Vtpe.

When the power supply voltage VDD is applied to the power supply terminal 101, the voltage Vtnd occurs in the source of the NMOS depletion transistor 202. This is achieved by increasing an aspect ratio of the NMOS depletion transistor 202 and decreasing a current value of the constant current circuit 103. Since the voltage Vtnd is applied to the gate of the NMOS depletion transistor 201, a voltage (Vtnd+Vtnd)=Vtnd×2 occurs in the source thereof. This is achieved by increasing an aspect ratio of the NMOS depletion transistor 201. Since the voltage Vtnd×2 is applied to the gate of the PMOS transistor 106, a voltage (Vtnd×2+Vtpe) occurs in the source thereof. This is achieved by increasing an aspect ratio of the PMOS transistor 106 and decreasing a current value of the constant current circuit 104. When a reference voltage generated at the output terminal 102 is taken to be Vref, the reference voltage Vref becomes Vref=Vtnd×2+Vtpe.

Each of the NMOS depletion transistors 201 and 202 has a characteristic that the absolute value Vtnd of the threshold voltage of each of the NMOS depletion transistors 201 and 202 becomes large as the temperature becomes high. The PMOS transistor 106 has a characteristic that the threshold voltage Vtpe thereof becomes small as the temperature becomes high. Since the reference voltage Vref is a voltage obtained by adding the threshold voltage Vtnd that becomes large as the temperature increases, and the threshold voltage Vtpe that becomes small as the temperature increases, it becomes a voltage excellent in temperature characteristic if their temperature characteristics are set to be canceled out.

Incidentally, the reference voltage Vref becomes (Vtnd×n+Vtpe) by connecting n transistors similar in configuration to the NMOS depletion transistor 201. The voltage value of the reference voltage Vref can further be raised.

As described above, the reference voltage circuit according to the second embodiment can output the reference voltage excellent in temperature characteristic by using the source follower of the NMOS depletion transistors 201 and 202 and the source follower of the PMOS transistor 106. Further, the voltage value of the reference voltage can be made high by the number of the NMOS depletion transistors.

Third Embodiment

Figure 3:
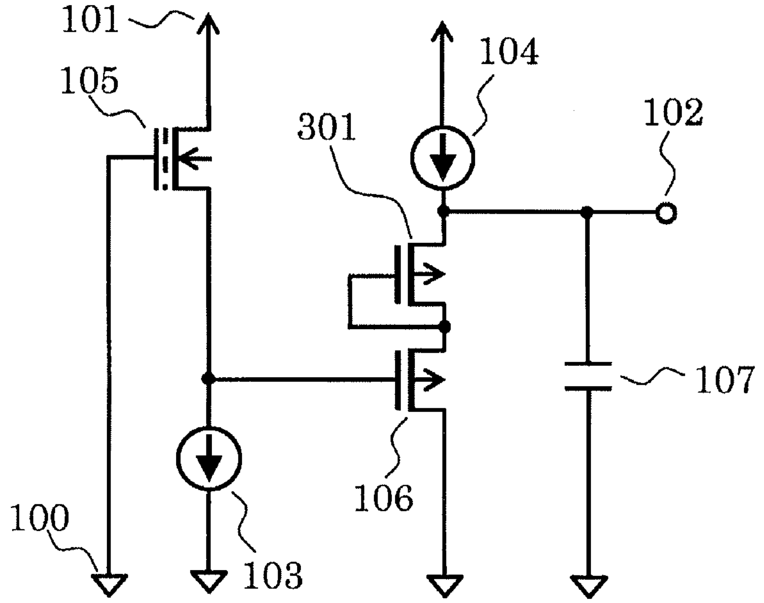
FIG. 3 is a circuit diagram illustrating a configuration of a reference voltage circuit according to a third embodiment.

FIG. 3 is a circuit diagram of a reference voltage circuit according to a third embodiment. A difference from FIG. 1 resides in that a PMOS transistor 301 is added. Others are similar to those in FIG. 1.

A description will be made about the connections of the reference voltage circuit according to the third embodiment. The PMOS transistor 301 has a gate and a drain connected to the source of the PMOS transistor 106, and a source connected to the output terminal 102. Others are similar to those in FIG. 1.

The operation of the reference voltage circuit according to the third embodiment will next be described. The NMOS depletion transistor 105 configures a first stage source follower with the constant current circuit 103 as a load. The PMOS transistors 106 and 301 configure a second stage source follower with the constant current circuit 104 as a load. An absolute value of a threshold voltage of the NMOS depletion transistors 105 is assumed to be Vtnd, and a threshold voltage of each of the PMOS transistors 106 and 301 is assumed to be Vtpe.

When the power supply voltage VDD is applied to the power supply terminal 101, the voltage Vtnd occurs in the source of the NMOS depletion transistor 105. This is achieved by increasing an aspect ratio of the NMOS depletion transistor 105 and decreasing a current value of the constant current circuit 103. Since the voltage Vtnd is applied to the gate of the PMOS transistor 106, a voltage (Vtnd+Vtpe) occurs in the source thereof. This is achieved by increasing an aspect ratio of the PMOS transistor 106 and decreasing a current value of the constant current circuit 104. Since the voltage (Vtnd+Vtpe) is applied to the gate of the PMOS transistor 301, a voltage (Vtnd+Vtpe+Vtpe=Vtnd+Vtpe×2) occurs in the source thereof. This is achieved by increasing an aspect ratio of the PMOS transistor 301. When a reference voltage generated at the output terminal 102 is taken to be Vref, the reference voltage Vref becomes Vref=Vtnd+Vtpe×2.

The NMOS depletion transistor 105 has a characteristic that the absolute value Vtnd of the threshold voltage thereof becomes large as the temperature becomes high. Each of the PMOS transistors 106 and 301 has a characteristic that the threshold voltage Vtpe thereof becomes small as the temperature becomes high. Since the reference voltage Vref is a voltage obtained by adding the threshold voltage Vtnd that becomes large as the temperature increases, and the threshold voltage Vtpe that becomes small as the temperature increases, it becomes a voltage excellent in temperature characteristic if their temperature characteristics are set to be canceled out.

Incidentally, although the third embodiment has been described using the two PMOS transistors, it is not limited to this configuration. By increasing the number of PMOS transistors and connecting n PMOS transistors in like manner, Vref becomes (Vtnd+Vtpe×n) and hence the voltage value of the reference voltage Vref can further be raised. Further, a similar effect is obtained even if the PMOS transistor 301 is changed to a diode.

As described above, the reference voltage circuit according to the third embodiment can output the reference voltage Vref excellent in temperature characteristic by using the source follower of the NMOS depletion transistor 105 and the source follower of the PMOS transistors 106 and 301. Further, the voltage value of the reference voltage Vref can be made high by the number of the PMOS transistors.

Fourth Embodiment

Figure 4:
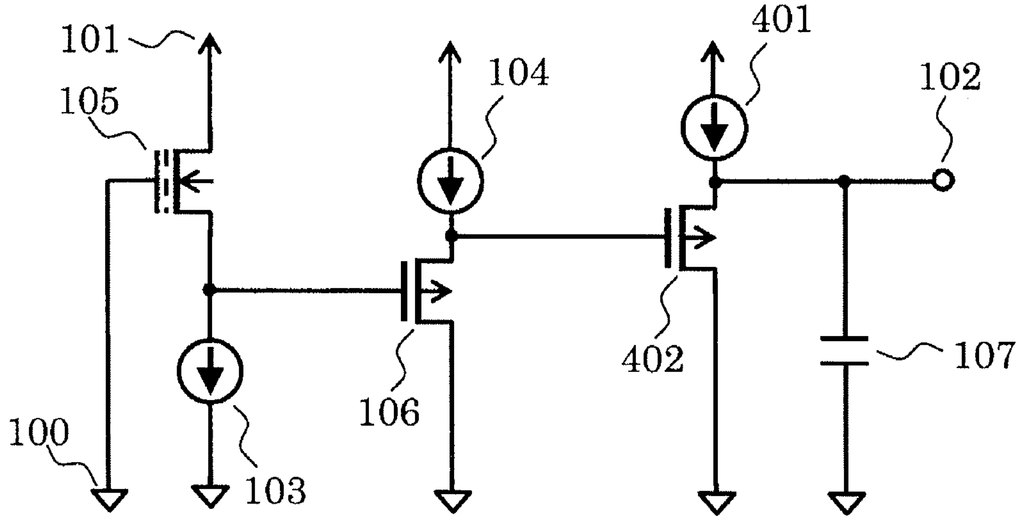
FIG. 4 is a circuit diagram illustrating a configuration of a reference voltage circuit according to a fourth embodiment.

FIG. 4 is a circuit diagram of a reference voltage circuit according to a fourth embodiment. A difference from FIG. 1 resides in that a PMOS transistor 402 and a constant current circuit 401 are added. Others are similar to those in FIG. 1.

A description will be made about the connections of the reference voltage circuit according to the fourth embodiment. The PMOS transistor 402 has a gate connected to the source of the PMOS transistor 106, a drain connected to the ground terminal 100, and a source connected to the output terminal 102. The constant current circuit 401 has one terminal connected to the power supply terminal 101 and the other terminal connected to the output terminal 102. Others are similar to those in FIG. 1.

The operation of the reference voltage circuit according to the fourth embodiment will next be described. The NMOS depletion transistor 105 configures a first stage source follower with the constant current circuit 103 as a load. The PMOS transistor 106 configures a second stage source follower with the constant current circuit 104 as a load. The PMOS transistor 402 configures a third stage source follower with the constant current circuit 401 as a load. An absolute value of a threshold voltage of the NMOS depletion transistor 105 is assumed to be Vtnd, and a threshold voltage of each of the PMOS transistors 106 and 402 is assumed to be Vtpe.

When the power supply voltage VDD is applied to the power supply terminal 101, the voltage Vtnd occurs in the source of the NMOS depletion transistor 105. This is achieved by increasing an aspect ratio of the NMOS depletion transistor 105 and decreasing a current value of the constant current circuit 103. Since the voltage Vtnd is applied to the gate of the PMOS transistor 106, a voltage (Vtnd+Vtpe) occurs in the source thereof. This is achieved by increasing an aspect ratio of the PMOS transistor 106 and decreasing a current value of the constant current circuit 104. Since the voltage (Vtnd+Vtpe) is applied to the gate of the PMOS transistor 402, a voltage (Vtnd+Vtpe+Vtpe)=(Vtnd+Vtpe×2) occurs in the source thereof. This is achieved by increasing an aspect ratio of the PMOS transistor 402 and decreasing a current value of the constant current circuit 401. When a reference voltage generated at the output terminal 102 is taken to be Vref, the reference voltage Vref becomes Vref=Vtnd+Vtpe×2.

The NMOS depletion transistor 105 has a characteristic that the absolute value Vtnd of the threshold voltage thereof becomes large as the temperature becomes high. Each of the PMOS transistors 106 and 402 has a characteristic that the threshold voltage Vtpe thereof becomes small as the temperature becomes high. Therefore, as the reference voltage Vref, a voltage excellent in temperature characteristic can be obtained by adding Vtnd that becomes large as the temperature becomes high, and Vtpe that becomes small as the temperature becomes high. The voltage value of the reference voltage Vref can be raised by the number of additions of Vtpe.

Incidentally, although the third stage source follower is added to the reference voltage circuit according to the fourth embodiment, the number of stages of source followers may be further increased. By configuring the source followers in n stages, the reference voltage Vref becomes (Vtnd+Vtpe×n).

Further, although the PMOS transistor has been added and described, the NMOS transistor may be added and connected in like manner.

Furthermore, a similar effect can be obtained even if the reference voltage circuits according to other embodiments are configured by adding source followers of n stages even thereto.

As described above, the reference voltage circuit according to the fourth embodiment can output the reference voltage Vref excellent in temperature characteristic by using the source follower of the NMOS depletion transistor 105 and the source follower of the PMOS transistors 106 and 402. Further, the voltage value of the reference voltage Vref can be made high by the number of stages of the source followers.

First Embodiment

Figure 5:
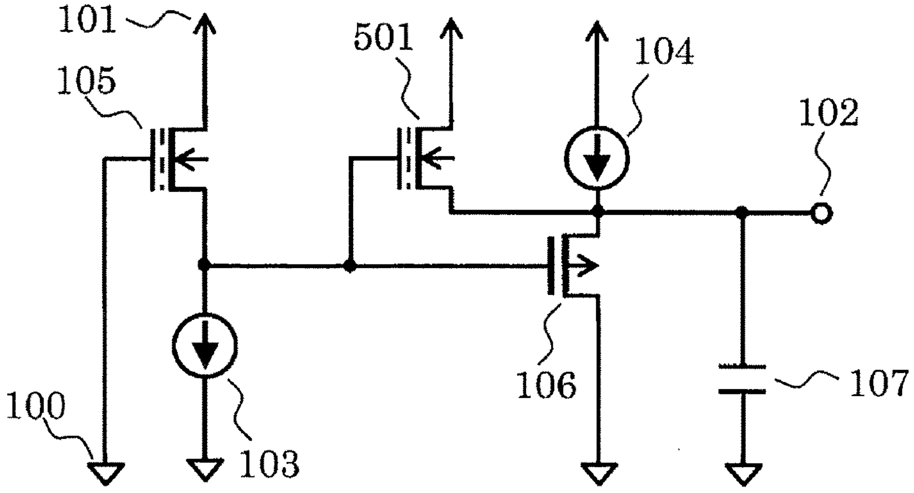
FIG. 5 is a circuit diagram illustrating a configuration of a reference voltage circuit according to a fifth embodiment.
Figure 6:
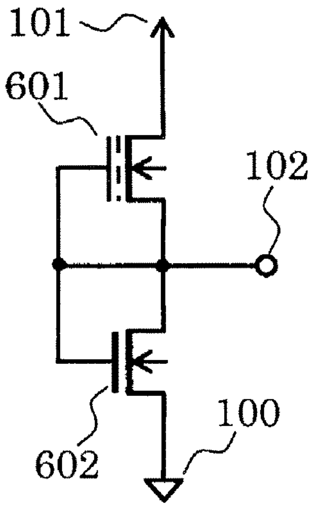
FIG. 6 PRIOR ART
FIG. 6 is a circuit diagram illustrating a configuration of a related art reference voltage circuit.

FIG. 5 is a circuit diagram of a reference voltage circuit according to a fifth embodiment. A difference from FIG. 1 resides in that a starting NMOS depletion transistor 501 is added. Others are similar to those in FIG. 1.

A description will be made about the connections of the reference voltage circuit according to the fifth embodiment. The NMOS depletion transistor 501 has a gate connected to the gate of the PMOS transistor 106, a source connected to the source of the PMOS transistor 106, and a drain connected to the ground terminal 101. Others are similar to those in FIG. 1.

The operation of the reference voltage circuit according to the fifth embodiment will next be described. When the power supply voltage VDD is applied to the power supply terminal 101, a voltage Vtnd is applied to the gate of the NMOS depletion transistor 501 so that the current flows from the NMOS depletion transistor 501 to the output terminal 102. Since the parasitic capacitances generated in the capacitor 107 and the output terminal 102 are charged by this current, the reference voltage circuit can be started up quickly.

Incidentally, although the reference voltage circuit according to the fifth embodiment has been described using the configuration in which the NMOS depletion transistor 501 is added to the circuit of FIG. 1, a similar effect is obtained even when it is added to the circuits according to other embodiments.

As described above, the reference voltage circuit according to the fifth embodiment is capable of outputting the reference voltage excellent in temperature characteristic and can be started up quickly.

As mentioned above, the reference voltage circuit of the present invention can output the reference voltage excellent in temperature characteristic and can be started up quickly.

Incidentally, the aspect ratios of the NMOS depletion transistor 105 and the PMOS transistor 106, and the current values of the constant current circuit 103 and the constant current circuit 104 may be set such that the temperature characteristics of their transistors are canceled out. They are not limited to increasing the aspect ratio and decreasing the current value.

Further, even if the reference voltage circuit of the present invention is configured by reversing the conductivity type of each transistor, a similar effect is obtained.

What is claimed is:

1. A reference voltage circuit comprising:

a first constant current circuit;

a first transistor of a first conductivity type having a source connected to the first constant current circuit, the first transistor having a gate-source voltage substantially equal to a threshold voltage and configured to operate as a first stage source follower;

a second constant current circuit;

a second transistor of a second conductivity type having a gate connected to the source of the first transistor and a source connected to the second constant current circuit, the second transistor having a gate-source voltage substantially equal to a threshold voltage and configured to operate as a second stage source follower; and an output terminal connected to the source of the second transistor.

2. The reference voltage circuit according to claim 1 further comprising a third transistor of a first conductivity type connected between the source of the first transistor and the first constant current circuit.

3. The reference voltage circuit according to claim 1 further comprising a third transistor having a gate and a drain connected to each other and connected between the source of the second transistor and the second constant current circuit.

4. The reference voltage circuit according to claim 1 further comprising a diode connected between the source of the second transistor and the second constant current circuit.

5. The reference voltage circuit according to claim 1, further including:

a third constant current circuit;

a fourth transistor of a second conductivity type having a gate connected to the second constant current circuit and a source connected to the third constant current circuit, the fourth transistor configured to operate as a third stage source follower.

6. The reference voltage circuit according to claim 5, further including a starting transistor having a gate connected to an input of each of the source followers on and after the second stage and a source connected to the output terminal of the reference voltage circuit.

7. The reference voltage circuit according to claim 1, wherein the gate of the first transistor is connected to ground potential.

8. The reference voltage circuit according to claim 1, wherein output terminal is further connected to a voltage stabilizing capacitor.

* * * * *